(12) United States Patent  
Lin

(10) Patent No.: US 7,250,677 B1
(45) Date of Patent: Jul. 31, 2007

(54) DIE PACKAGE STRUCTURE

(75) Inventor: Sem-Wei Lin, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 11/514,827

(22) Filed: Sep. 5, 2006

(30) Foreign Application Priority Data

Feb. 24, 2006 (CN) ................................ 95 1 06383

(51) Int. Cl.
*H01L 29/40* (2006.01)

(52) U.S. Cl. ...................... 257/723; 257/777

(58) Field of Classification Search ................ 257/723, 257/777
See application file for complete search history.

(56) References Cited

U.S. PATENT DOCUMENTS

| 5,394,010 | A  | * | 2/1995  | Tazawa et al. ............... 257/686 |
| 6,114,221 | A  | * | 9/2000  | Tonti et al. .................. 438/455 |
| 6,339,255 | B1 | * | 1/2002  | Shin ........................... 257/686 |
| 6,518,659 | B1 | * | 2/2003  | Glenn ......................... 257/704 |
| 6,667,544 | B1 | * | 12/2003 | Glenn ......................... 257/686 |
| 6,670,720 | B2 | * | 12/2003 | King et al. .................. 257/797 |
| 6,753,205 | B2 | * | 6/2004  | Halahan ..................... 438/107 |
| 6,753,599 | B2 | * | 6/2004  | Kim ............................ 257/686 |
| 6,781,243 | B1 | * | 8/2004  | Li et al. ...................... 257/777 |
| 7,109,576 | B2 | * | 9/2006  | Bolken et al. ............... 257/686 |

* cited by examiner

*Primary Examiner*—Roy Potter
(74) *Attorney, Agent, or Firm*—Volentine & Whitt, P.L.L.C.

(57) ABSTRACT

The present invention relates to a die package structure. The package structure comprises a first substrate, a first die, a sub-package and a first molding compound. The first die is disposed on the first substrate. The sub-package comprises a second substrate, a second die and a second molding compound. The second die is disposed on the second substrate. The second molding compound encapsulates the second die. The second molding compound has at least one protrusion, and the protrusion contacts with the first die. The first molding compound encapsulates the first die and the sub-package. Whereby, by utilizing the second molding compound that has the protrusion to replace the spacer in the stacked package, the packaging process can be shortened, and the components of the package can be reduced.

19 Claims, 2 Drawing Sheets

DIE PACKAGE STRUCTURE

BACKGROUND OF THE INVENTION

1. Field of the Invention

The invention relates to a die package structure, particularly to a die package structure using a molding compound that has protrusions to replace a spacer.

2. Description of the Related Art

FIG. 1 shows a conventional die package structure. The die package structure 1 comprises a first substrate 10, a first die 11, a sub-package 12, a spacer 13 and a first molding compound 14. The first die 11 is disposed on the first substrate 10. The first die 11 electrically connects to the first substrate 10 by a plurality of first wires 15. The sub-package 12 comprises a second substrate 121, a second die 122 and a second molding compound 123. The sub-package 12 electrically connects to the first substrate 10 by a plurality of second wires 16. The second die 122 is disposed on the second substrate 121. The second molding compound 123 encapsulates the second die 122. The spacer 13 is disposed between the first die 11 and the second molding compound 123. The first molding compound 14 encapsulates the first die 11 and the sub-package 12. In addition, a plurality of metal bumps 17 are formed on the bottom surface of the first substrate 10.

In the conventional die package structure, the spacer 13 must be disposed between the first die 11 and the sub-package 12, so that there is enough space on the first die 11 for wire bonding. Therefore, the steps of die packaging and the components of the package will increase.

Consequently, there is an existing need for providing a die package structure to solve the above-mentioned problems.

SUMMARY OF THE INVENTION

One objective of the present invention is to provide a die package structure. The package structure comprises a first substrate, a first die, a sub-package and a first molding compound. The first die is disposed on the first substrate. The sub-package comprises a second substrate, a second die and a second molding compound. The second die is disposed on the second substrate. The second molding compound encapsulates the second die. The second molding compound has at least one protrusion, and the protrusion contacts with the first die. The first molding compound encapsulates the first die and the sub-package.

The die package structure of the present invention utilizes the second molding compound that has the protrusion to replace the conventional spacer in a stacked package so as to form a space for wire bonding, so that the packaging process can be shortened, and the components of the package can be reduced.

DETAILED DESCRIPTION OF THE INVENTION

Figure 1:
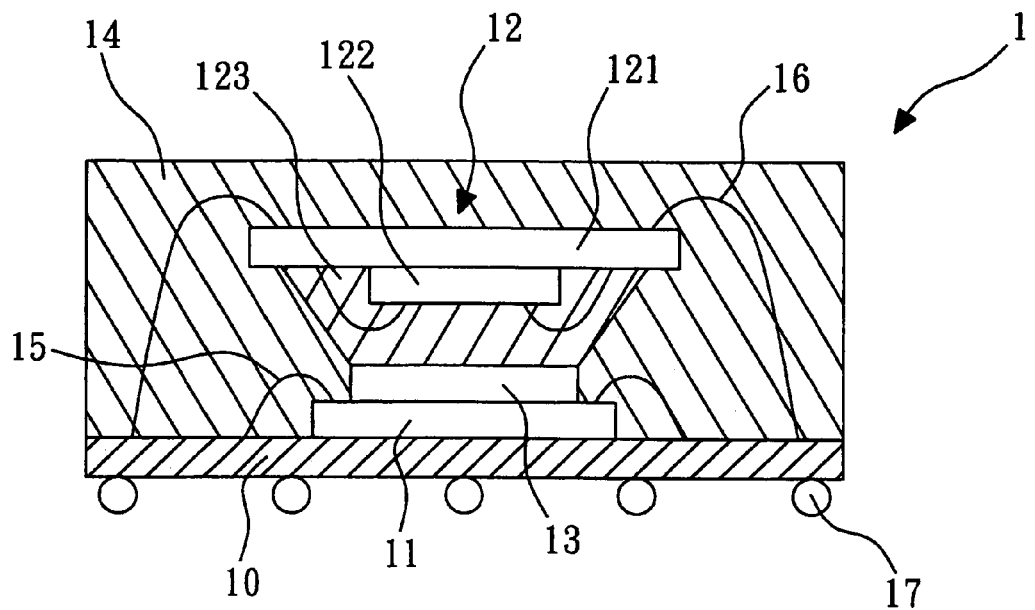
FIG. 1 shows a conventional die package structure.
Figure 2:
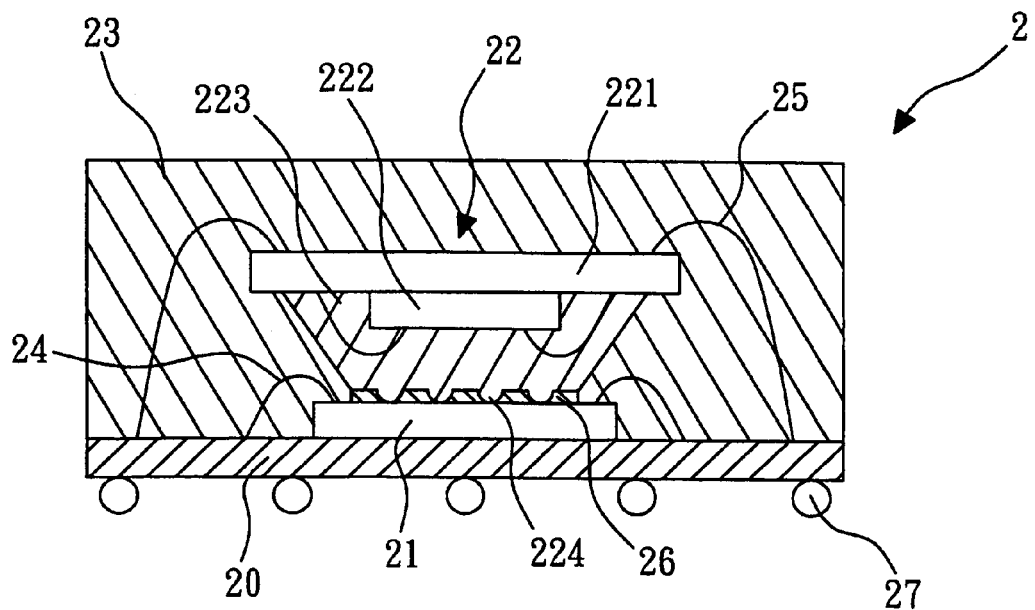
FIG. 2 shows a die package structure according to a first embodiment of the present invention.

FIG. 2 shows a die package structure 2 according to a first embodiment of the present invention. The die package structure 2 comprises a first substrate 20, a first die 21, a sub-package 22 and a first molding compound 23. The first die 21 is disposed on the first substrate 20. The first die 21 electrically connects to the first substrate 20 by a plurality of first wires 24. The sub-package 22 comprises a second substrate 221, a second die 222 and a second molding compound 223. The sub-package 22 electrically connects to the first substrate 20 by a plurality of second wires 25.

The second die 222 is disposed on a surface of the second substrate 221. The second molding compound 223 encapsulates the second die 222. The second molding compound 223 has a plurality of protrusions 224. The protrusions 224 are preformed by a mold of predetermined shape when the sub-package 22 is molded. In the embodiment, the protrusions 224 are hemispherical. In another application, the protrusions 224 may be massy. The protrusions 224 contact with the first die 21 and are disposed on the first die 21 by an adhesive material 26. The first molding compound 23 is used for encapsulating the first die 21 and the sub-package 22. In addition, a plurality of metal bumps 27 are formed on the bottom surface of the first substrate 20.

In the first embodiment, the second molding compound 223 has a plurality of protrusions 224, so that the protrusions 224 can replace the conventional spacer to form a space for wire bonding in the die package 2. Therefore, the packaging process can be shortened, and the components of the die package 2 can be reduced.

Figure 3:
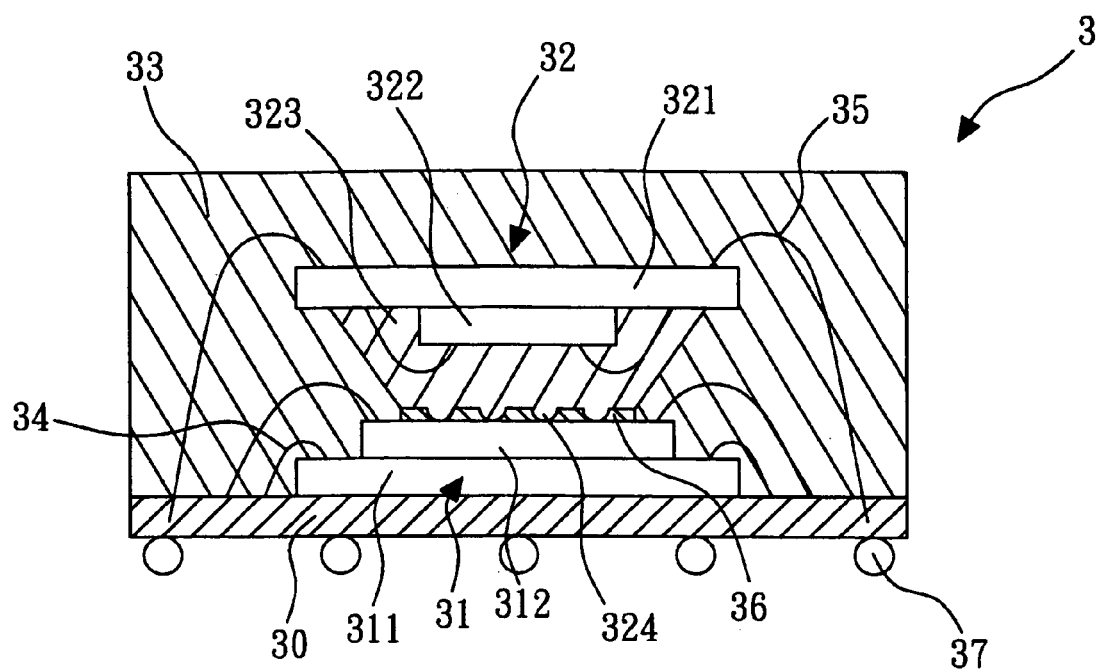
FIG. 3 shows a die package structure according to a second embodiment of the present invention.

FIG. 3 shows a die package structure 3 according to a second embodiment of the present invention. The die package structure 3 comprises a first substrate 30, a die group 31, a sub-package 32 and a first molding compound 33. The die group 31 is disposed on the first substrate 30. The die group 31 has a second die 311 and a third die 312. The third die 312 is disposed on the second die 311, and the third die 312 is smaller than the second die 311. The die group 31 electrically connects to the first substrate 30 by a plurality of first wires 34. The sub-package 32 comprises a second substrate 321, a first die 322 and a second molding compound 323. The sub-package 32 electrically connects to the first substrate 30 by a plurality of second wires 35. The first die 322 is disposed on a surface of the second substrate 321.

The second molding compound 323 encapsulates the first die 322. The second molding compound 323 has a plurality of protrusions 324. The protrusions 324 are preformed by a mold of predetermined shape when the sub-package 32 is molded. In the embodiment, the protrusions 324 are hemispherical. In another application, the protrusions 324 may be massy. The protrusions 324 contact with the die group 31 and are disposed on the third die 312 by an adhesive material 36. The first molding compound 33 is used for encapsulating the die group 31 and the sub-package 32. In addition, a plurality of metal bumps 37 are formed on the bottom surface of the first substrate 30.

In the second embodiment, the second molding compound 323 has a plurality of protrusions 324 and is disposed on the third die 312 by an adhesive material 36. Therefore, the protrusions 324 can replace the conventional spacer to form a space for wire bonding in the die package 3. The packaging process can thereby be shortened, and the components of the die package 3 can be reduced.

Figure 4:
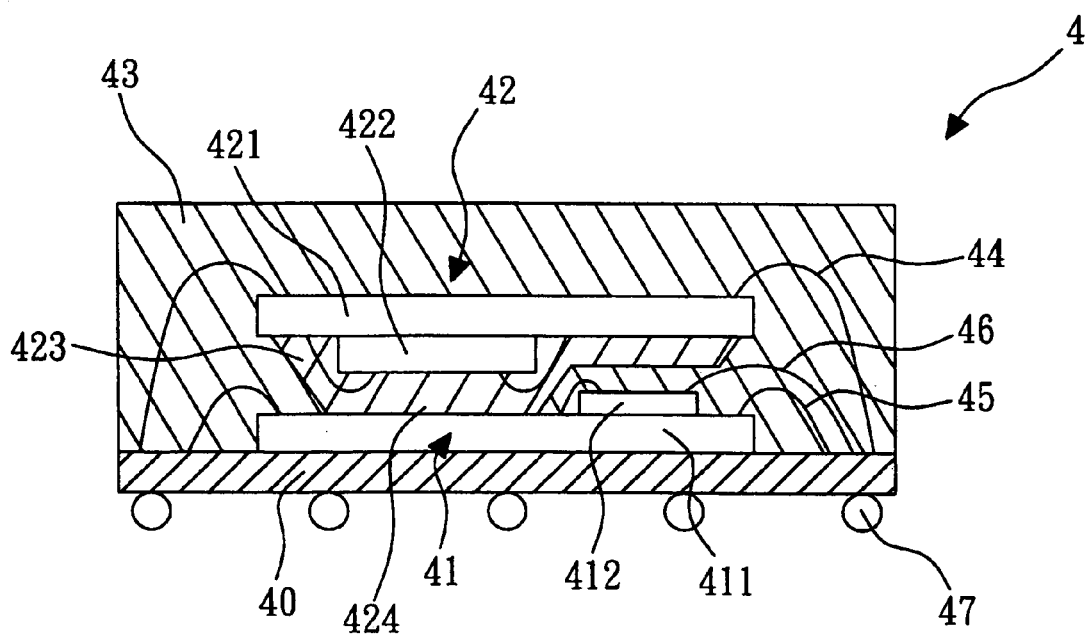
FIG. 4 shows a die package structure according to a third embodiment of the present invention.

FIG. 4 shows a die package structure 4 according to a third embodiment of the present invention. The die package structure 4 of the third embodiment comprises a first substrate 40, a die group 41, a sub-package 42 and a first molding compound 43. The die group 41 is disposed on the first substrate 40. The die group 41 has a second die 411 and a third die 412. The third die 412 is disposed on the second die 411, and the third die 412 is smaller than the second die 411.

The second die 411 electrically connects to the first substrate 40 by a plurality of third wires 45, and the third die 412 electrically connects to the first substrate 40 and the second die 411 by a plurality of fourth wires 46. The sub-package 42 comprises a second substrate 421, a first die 422 and a second molding compound 423. The sub-package 42 electrically connects to the first substrate 40 by a plurality of second wires 44. The first die 422 is disposed on a surface of the second substrate 421.

The second molding compound 423 encapsulates the first die 422. The second molding compound 423 has a protrusion 424. The protrusion 424 is preformed by a mold of predetermined shape when the sub-package 42 is molded. The protrusion 424 is massy. The height of the protrusion 424 is larger than the height of the third die 412, and the protrusion 424 and the third die 412 are disposed on the second die 411. The first molding compound 43 is used for encapsulating the die group 41 and the sub-package 42. In addition, a plurality of metal bumps 47 are formed on the bottom surface of the first substrate 40.

In the third embodiment, the height of the protrusion 424 is larger than the height of the third die 412. The protrusion 424 and the third die 412 are disposed on the second die 411 so as to form a space for the third die 412 to be disposed between the second molding compound 423 and the second die 411. Therefore, the protrusion 424 can replace the conventional spacer to form a space for wire bonding in the die package 4. The packaging process can thereby be shortened, the components of the die package 4 can be reduced, and the height of the die package 4 can be reduced.

The die package structure of the present invention utilizes a molding compound that has at least one protrusion to replace the conventional spacer in a stacked package so as to form a space for wire bonding, so that the packaging process can be shortened, and the components of the package can be reduced. Furthermore, another die may be disposed in the space formed by the protrusion, so that the height of the die package structure can be reduced.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A die package structure comprising:
   a first substrate;
   a first die, disposed on the first substrate;
   a sub-package, the sub-package comprising:
      a second substrate;
      a second die, disposed on a surface of the second substrate; and
      a second molding compound, for encapsulating the second die, and the second molding compound having at least one protrusion contacting with the first die; and
   a first molding compound, for encapsulating the first die and the sub-package.

2. The die package structure according to claim 1, further comprising a plurality of first wires for electrically connecting the first die and the first substrate.

3. The die package structure according to claim 1, further comprising a plurality of second wires for electrically connecting the sub-package and the first substrate.

4. The die package structure according to claim 1, wherein the protrusion is hemispherical.

5. The die package structure according to claim 1, wherein the protrusion is massy.

6. The die package structure according to claim 1, wherein the protrusion is disposed on the first die by an adhesive material.

7. The die package structure according to claim 1, further comprising a plurality of metal bumps formed on the bottom surface of the first substrate.

8. The die package structure according to claim 1, wherein the protrusion is preformed by a mold of predetermined shape.

9. A die package structure comprising:
   a first substrate;
   a die group, disposed on the first substrate and having at least two dice;
   a sub-package, the sub-package comprising:
      a second substrate;
      a first die, disposed on a surface of the second substrate; and
      a second molding compound, for encapsulating the first die, and the second molding compound having at least one protrusion contacting with the die group; and
   a first molding compound, for encapsulating the die group and the sub-package.

10. The die package structure according to claim 9, further comprising a plurality of first wires for electrically connecting the die group and the first substrate.

11. The die package structure according to claim 9, further comprising a plurality of second wires for electrically connecting the sub-package and the first substrate.

12. The die package structure according to claim 9, wherein the protrusion is hemispherical.

13. The die package structure according to claim 9, wherein the protrusion is massy.

14. The die package structure according to claim 9, wherein the die group has a second die and a third die, the third die is disposed on the second die, and the third die is smaller than the second die.

15. The die package structure according to claim 14, wherein the protrusion is disposed on the third die by an adhesive material.

16. The die package structure according to claim 14, wherein the height of the protrusion is larger than the height of the third die, and the protrusion and the third die are disposed on the second die.

17. The die package structure according to claim 14, further comprising a plurality of third wires and a plurality of fourth wires, the second die electrically connecting to the first substrate by the third wires, and the third die electrically connecting to the first substrate and the second die by the fourth wires.

18. The die package structure according to claim 9, further comprising a plurality of metal bumps formed on the bottom surface of the first substrate.

19. The die package structure according to claim 9, wherein the protrusion is preformed by a mold of predetermined shape.

* * * * *